United States Patent
Li (10) Patent No.: US 7,123,997 B2
(45) Date of Patent: Oct. 17, 2006

(54) GAP ADJUSTMENT APPARATUS AND GAP ADJUSTMENT METHOD FOR ADJUSTING GAP BETWEEN TWO OBJECTS

(75) Inventor: Xuan Li, Nishitokyo (JP)

(73) Assignee: Sumitomo Heavy Industries Ltd., Tokyo (JP)

( * ) Notice: Subject to any disclaimer, the term of this patent is extended or adjusted under 35 U.S.C. 154(b) by 0 days.

(21) Appl. No.: 10/911,554

(22) Filed: Aug. 5, 2004

(65) Prior Publication Data

US 2005/0015183 A1   Jan. 20, 2005

Related U.S. Application Data

(62) Division of application No. 09/993,500, filed on Nov. 27, 2001, now Pat. No. 6,852,988.

(30) Foreign Application Priority Data

Nov. 28, 2000  (JP) ............................. 2000-360502
Oct. 10, 2001  (JP) ............................. 2001-312624

(51) Int. Cl.
*G05D 3/00* (2006.01)
*G01B 21/16* (2006.01)
*G01B 11/14* (2006.01)

(52) U.S. Cl. .................. 700/302; 702/158; 250/491.1; 356/615

(58) Field of Classification Search .... 73/865.8–865.9, 73/1.79, 432.1; 702/158; 700/195, 302–303, 700/117–121, 192–193; 269/45; 324/671, 324/686, 690, 662; 250/491.1; 378/204–205, 378/207–208; 356/615, FOR. 128
See application file for complete search history.

(56) References Cited

U.S. PATENT DOCUMENTS

| | | | |
|---|---|---|---|
| 2,422,807 A | 6/1947 | Smith | 250/306 |
| 2,670,440 A | 2/1954 | Gordon et al. | 250/453.11 |
| 2,689,779 A | 9/1954 | Grimm et al. | 445/64 |
| 2,788,453 A | 4/1957 | Lusted | 378/96 |
| 4,475,223 A | 10/1984 | Taniguchi et al. | 250/491.1 |
| 4,587,493 A | 5/1986 | Sepponen | 324/319 |
| 4,926,358 A | 5/1990 | Tsai et al. | 700/302 |
| 5,073,912 A | 12/1991 | Kobayashi et al. | 250/491.1 |
| 5,377,009 A | 12/1994 | Kitsake et al. | 356/401 |
| 5,573,877 A | 11/1996 | Inoue et al. | 250/491.1 |
| 6,406,227 B1 | 6/2002 | Titus et al. | 700/195 |
| 2002/0034915 A1 | 3/2002 | Nakatani | 445/2 |
| 2002/0163741 A1 | 11/2002 | Shibazaki | 359/819 |
| 2004/0178805 A1* | 9/2004 | Kitaoka | 324/662 |

(Continued)

FOREIGN PATENT DOCUMENTS

EP    130497 A2    1/1985

(Continued)

*Primary Examiner*—Thomas P. Noland
(74) *Attorney, Agent, or Firm*—Arent Fox PLLC (57) ABSTRACT

A first stage and a second stage are disposed to face each other. A first object is fixed on the first stage. A first displacement sensor attached on the first stage is used to measure a distance extending from the first displacement sensor to a plane disposed in front of the first displacement sensor. A second object is fixed on the second stage. A second displacement sensor attached on the second stage is used to measure a distance extending from the second displacement sensor to a plane disposed in front of the second displacement sensor. A moving mechanism is provided to move one of the first stage and the second stage, with the movement of one stage being relative to the other stage.

3 Claims, 6 Drawing Sheets

U.S. PATENT DOCUMENTS

2005/0005707 A1* 1/2005 Li .................. 700/302 X

FOREIGN PATENT DOCUMENTS

| EP | 130691 A2 | 1/1985 |
| EP | 242178 A2 | 10/1987 |
| EP | 344646 A2 | 12/1989 |
| EP | 349632 B1 | 7/1992 |
| JP | 58-103136 | 6/1983 |
| JP | 03109716 A * | 5/1991 |
| JP | 04-226012 | 8/1992 |

* cited by examiner

GAP ADJUSTMENT APPARATUS AND GAP ADJUSTMENT METHOD FOR ADJUSTING GAP BETWEEN TWO OBJECTS

This is a divisional application of U.S. patent application Ser. No. 09/993,500, filed on Nov. 27, 2001, and now U.S. Pat. No. 6,852,988, issued Feb. 8, 2005. The disclosure of the parent application is incorporated by reference herein. This application is based on Japanese Patent Applications 2000-219366 filed on Jul. 19, 2000, 2000-360502 filed on Nov. 28, 2000, and 2001-312624 filed on Oct. 10, 2001, the entire contents of which are incorporated herein by reference.

BACKGROUND OF THE INVENTION

1) Field of the Invention

The present invention relates to a gap adjustment apparatus and a gap adjustment method, and more particularly, to a gap adjustment apparatus and a gap adjustment method suitable for adjusting a gap between a wafer and a mask (which are both used in X-ray lithography and electron beam exposure).

2) Description of the Related Art

In X-ray lithography and electron beam exposure, a mask is usually disposed in a position above a wafer (which will later be exposed) with a small gap formed between the wafer and the mask. In this manner, the surface of the wafer can be subjected to an exposure treatment by passing light through the mask. However, in order to improve the resolution and alignment precision, it is extremely important to precisely control the gap between the wafer and the mask. In particular, if such a gap is too large, a half-shadow problem will occur, resulting in reduced resolution as well as reduced alignment precision.

As a method for measuring the gap between the wafer and the mask, a method in which a high resolution camera is used to perform image processing, and another method in which a high resolution camera and electrostatic capacitance type sensors are used in combination are known.

However, since the electrostatic capacitance type sensors and the high-resolution camera are both quite expensive, if a gap measurement method employs both the electrostatic capacitance type sensors and the high-resolution camera, the overall apparatus for carrying out such a method will become expensive. In particular, an electrostatic capacitance type sensor capable of measuring a gap of 50 µm or smaller is extremely expensive. Moreover, it will be necessary to use expensive lens to photograph a gap of 20 µm or smaller.

In addition, a high-resolution camera usually requires a large space in order to be installed in an appropriate manner. For this reason, it will be difficult to manufacture a compact exposure apparatus.

SUMMARY OF THE INVENTION

It is an object of the present invention to provide an improved gap adjustment apparatus which is compact and which can be produced at low cost.

It is another object of the present invention to provide an improved method for measuring the aforementioned gap by using the improved gap adjustment apparatus.

According to one aspect of the present invention, there is provided a gap adjustment apparatus comprising: a first stage defining a first reference surface; a second stage defining a second reference surface, the second stage being opposite to the first stage in a manner such that the second reference surface becomes parallel to the first reference surface; a first chuck for fixing a first object having a main surface on the first stage, in a manner such that the main surface of the first object faces towards the second stage and becomes parallel to the first reference surface; a first displacement sensor attached on the first stage and adapted to measure a distance between the first displacement sensor and a certain plane disposed in front of the first displacement sensor and parallel to the second reference surface; a second chuck for fixing a second object having a main surface on the second stage, in a manner such that the main surface of the second object faces towards the first stage and becomes parallel to the second reference surface; a second displacement sensor attached on the second stage and capable of measuring a distance between the second displacement sensor and a certain plane disposed in front of the second displacement sensor and parallel to the first reference surface; an eddy current sensor attached on the first stage and having a sensor reference surface parallel to the first reference surface; an eddy current sensor target attached on the second stage and having a target reference surface parallel to the second reference surface; a moving mechanism for moving one of the first stage and the second stage in a direction parallel to the first reference surface and in another direction perpendicular to the first reference surface, with the movement of one stage being relative to the other stage; a controller which is adapted to drive the moving mechanism in a manner such that the target can be located in front of the first displacement sensor, to measure a distance extending from the first displacement sensor to the target reference surface of the target, to drive the moving mechanism in a manner such that the second main surface can be located in front of the first displacement sensor, to measure a distance extending from the first displacement sensor to the second main surface, to drive the moving mechanism in a manner such that the eddy current sensor can be located in front of the second displacement sensor, to measure a distance extending from the second displacement sensor to the sensor reference surface of the eddy current sensor, to drive the moving mechanism in a manner such that the first main surface can be located in front of the second displacement sensor, to measure a distance extending from the second displacement sensor to the first main surface, to drive the moving mechanism in a manner such that the target can be located in front of the eddy current sensor, and to measure an distance between the sensor reference surface and the target reference surface.

In this way, based on the difference between the distance extending from the first displacement sensor to the target reference surface and the distance extending from the first displacement sensor to the main surface of the second object, it is possible to determine a height difference between a height from the second reference surface to the target reference surface and a height from the second reference surface to the main surface of the second object. Similarly, it is possible to determine a height difference between a height from the first reference surface to the sensor reference surface and a height from the first reference surface to the main surface of the first object. Therefore, by using this difference information as well as the distance between the sensor reference surface and the target reference surface, it is possible to obtain the distance between the main surface of the first object and the main surface of the second object.

Furthermore, since the eddy current sensor is compact, even if the apparatus does not have sufficient internal space, such an eddy current sensor can still be disposed in a predetermined position. Moreover, since the eddy current sensor is relatively inexpensive, it is possible to manufacture the apparatus at low-cost.

According to another aspect of the present invention, there is provided a gap adjustment method comprising: a first step of fixing a first object on a first stage defining a first reference surface, in a manner such that a main surface of the first object becomes parallel to the first reference surface; a second step of fixing a second object on a second stage defining a second reference surface parallel to the first reference surface, in a manner such that a main surface of the second object becomes parallel to the second reference surface; a third step of calculating or adjusting a relationship between a sensor reference surface's height from the first reference surface and a height from the first reference surface to the main surface of the first object, a position of the sensor reference surface being fixed relative to a reference surface of an eddy current sensor attached on the first stage; a fourth step of calculating or adjusting a relationship between a target reference surface's height from the second reference surface and a height from the second reference surface to the main surface of the second object, the target reference surface being a target reference surface of an eddy current sensor target being fixed relative to the second stage; and a fifth step of measuring a distance extending from the sensor reference surface of the eddy current sensor to the target reference surface, and for adjusting a distance between the first stage and the second stage so as to enable a measurement result to be closer to a desired value.

In the above third step, it is possible to determine the relationship between a height from the first reference surface to the sensor reference surface and a height from the first reference surface to the main surface of the first object. In the above fourth step, it is possible to determine the relationship between a height from the second reference surface to the target reference surface and a height from the second reference surface to the main surface of the second object. Therefore, if the distance extending from the sensor reference surface to the target reference surface is known, it is possible to obtain the distance between the main surface of the first object and the main surface of the second object.

According to a further aspect of the present invention, there is provided a gap adjustment apparatus comprising: a mask chuck for holding a mask having a mask pattern formed thereon; a first leveling mechanism for holding the mask chuck and capable of moving the mask chuck in a first direction perpendicular to a surface on which the mask pattern of the mask fixed on the mask chuck has been formed; a mask stage for supporting the first leveling mechanism; a wafer chuck for holding the wafer in a manner such that an exposure surface of the wafer is caused to face towards the mask; a second leveling mechanism capable of moving the wafer chuck in the first direction; a wafer stage for holding the second leveling mechanism; a first distance sensor attached on the mask stage and capable of measuring a distance in the first direction, the distance extending to the exposure surface of the wafer held on the wafer chuck; and a second distance sensor attached on the wafer stage and capable of measuring a distance in the first direction, the distance extending to the surface of the mask fixed on the mask chuck, and also capable of measuring another distance in the first direction, the other distance extending to the first distance sensor.

When $D_A$ represents a distance extending from the second distance sensor to the first distance sensor, $D_B$ represents a distance extending from the second distance sensor to the surface of the mask, and $D_D$ represents a distance extending from the first distance sensor to the exposure surface of the wafer, it is possible for the distance between the mask and the wafer to be represented by $D_D-(D_A-D_B)$. The measured value is then compared with a desired value, while the first leveling mechanism or the second leveling mechanism is operated so that $D_D-(D_A-D_B)$ becomes closer to the desired value, thereby effecting an adjustment of the distance between the mask and the wafer.

In this way, it becomes possible to measure the distance between the mask and the wafer at a relatively low cost and a high precision.

According to a still further aspect of the present invention, there is provided a gap adjustment method comprising: a step of disposing a first measurement object having a first surface and a second measurement object having a second surface so that the first surface and the second surface face each other, in a manner such that the first surface of the first measurement object and the second surface of the second measurement object become perpendicular to a first direction; a step of measuring a distance $D_A$ in the first direction, the distance extending from a first distance sensor to a second distance sensor; a step of measuring a distance $D_B$ in the first direction, the distance extending from the second distance sensor to the surface of the first measurement object; a step of measuring a distance $D_D$ in the first direction, the distance extending from the first distance sensor to the second surface of the second measurement object; and a step of moving at least one of the first measurement object and the second measurement object in the first direction to make $D_D-(D_A-D_B)$ closer to a desired value.

According to one more aspect of the present invention, there is provided a gap adjustment apparatus comprising: a first holding member for fixing and holding a first measurement object having a first surface; a first leveling mechanism capable of holding the first holding member and moving the first holding member in a first direction perpendicular to the first surface of the first measurement object fixed on the first holding member; a first stage for holding the first leveling mechanism; a second holding member for holding a second measurement object having a second surface, in a manner such that second surface faces towards the first surface; a second leveling mechanism capable of moving the second holding member in the first direction; a second stage for holding the second leveling mechanism; a first distance sensor attached on the first stage, capable of measuring a distance in the first direction extending to the second surface of the second measurement object fixed on the second holding member; and a second distance sensor attached on the second stage, for measuring a distance in the first direction extending to the first surface of the first measurement object fixed on the first holding member, and another distance in the first direction extending to the first distance sensor.

When $D_A$ represents a distance extending from the second distance sensor to the first distance sensor, $D_B$ represents a distance extending from the second distance sensor to the first surface of the first measurement object, and $D_D$ represents a distance extending from the first distance sensor to the second surface of the second measurement object, it is possible for the distance between the first measurement object and the second measurement object to be represented by $D_D-(D_A-D_B)$. The measured value is then compared with a desired value, while the first leveling mechanism or the second leveling mechanism is operated so that $D_D-(D_A-D_B)$ becomes closer to the desired value, thereby effecting an adjustment of the distance between the first measurement object and the second measurement object.

According to another aspect of the present invention, there is provided a gap adjustment apparatus comprising: a first holder for holding a first object having a first measurement surface; a second holder for holding a second object having a second measurement surface, in a manner such that the second measurement surface faces the first measurement surface; a first displacement gauge for measuring a distance extending from the first displacement gauge to the first measurement surface; a target whose relative position with respect to the first displacement gauge is fixed, the target having a target measurement surface orientated in the same direction as the second measurement surface; a second displacement gauge for measuring distances extending from the second displacement gauge to the second measurement surface and to the target measurement surface; and a moving mechanism for moving at least one of the first holder and the second holder, in order to alter a gap between the first measurement surface and the second measurement surface.

With the use of the above gap adjustment apparatus formed according to the present invention, it is possible to measure in advance a distance extending from the first displacement gauge to the target measurement surface. In this way, by measuring a distance extending from the second displacement gauge to the target measurement surface, it is possible to calculate a distance between the first displacement gauge and the second displacement gauge. Therefore, it is possible to measure a gap between the first measurement surface and the second measurement surface, in accordance with a distance between the first displacement gauge and the first measurement surface, and a distance between the second displacement gauge and the second measurement surface, as well as a distance between the first displacement gauge and the second displacement gauge.

According to another aspect of the present invention, there is provided a gap adjustment method comprising the steps of: holding a first object having a first measurement surface and a second object having a second measurement surface, in a manner such that the second measurement surface is caused to face the first measurement surface; using a first displacement gauge to measure a distance $D_D$ extending from the first displacement gauge to the first measurement surface; using a second displacement gauge to measure a distance $D_A$ extending from the second displacement gauge to the second measurement surface; and using a distance $D_B$ extending from the second displacement gauge to a target measurement surface whose relative position with respect to the first displacement gauge is fixed, a distance $D_C$ extending from the first displacement gauge to the target measurement surface, as well as the distance $D_D$ and the distance $D_A$ to calculate $D_A+D_D-(D_B+D_C)$ and obtain a gap between the first measurement surface and the second measurement surface.

DETAILED DESCRIPTION OF THE PREFERRED EMBODIMENTS

Figure 1:
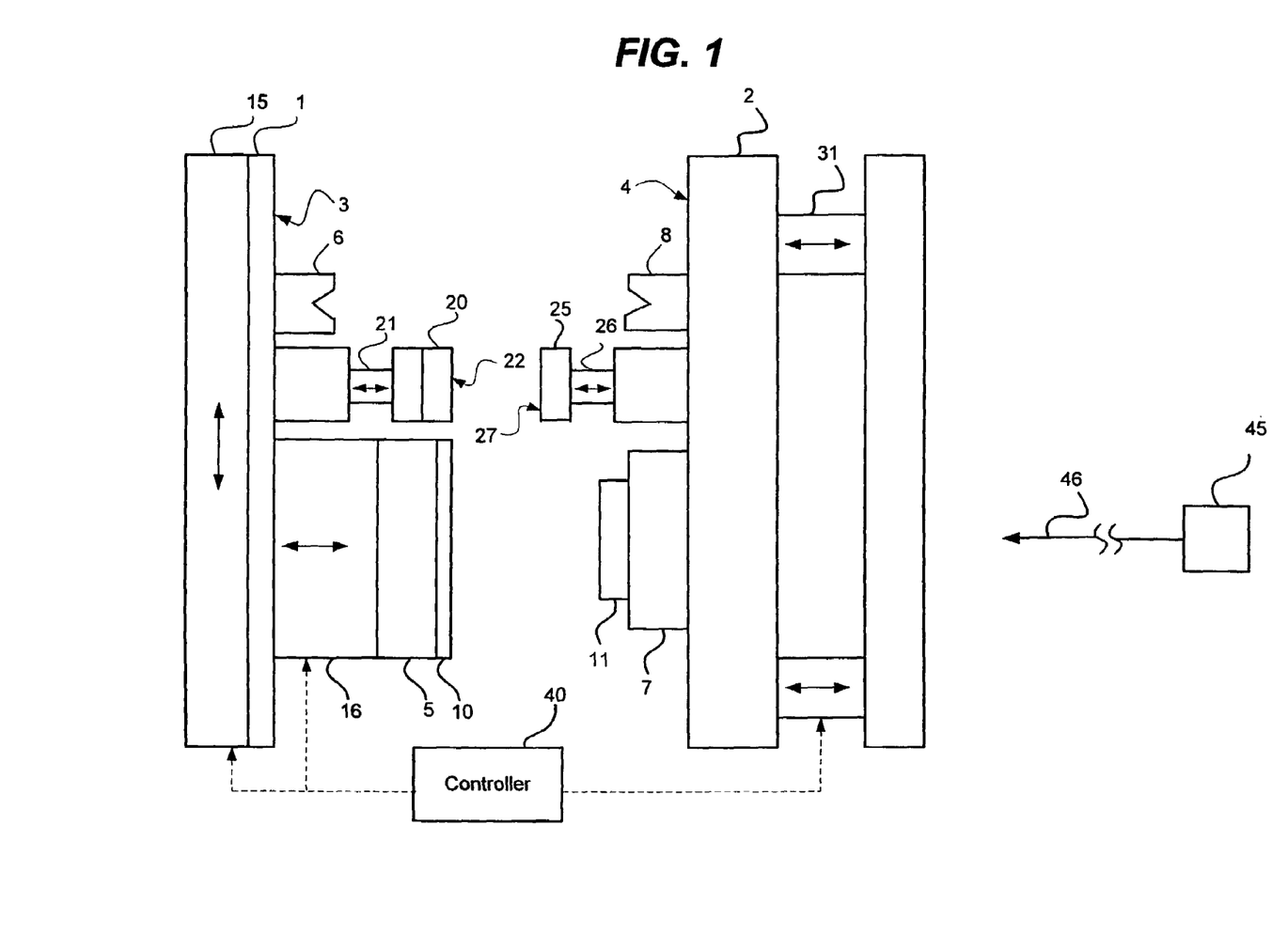
FIG. 1 is a schematic view showing an X-ray exposure apparatus formed according to a first embodiment of the present invention.

FIG. 1 is a schematic view showing an X-ray exposure apparatus formed according to a first embodiment of the present invention. As shown in the drawing, a wafer stage 1 is provided to define a virtual wafer reference surface 3, while a mask stage 2 is provided to define a virtual mask reference surface 4. Here, the wafer stage 1 and the mask stage 2 are arranged to face each other, with the virtual wafer reference surface 3 and the virtual mask reference surface 4 being parallel to one another.

A wafer chuck 5 is mounted and installed on the wafer stage 1 by a moving mechanism 16. The moving mechanism 16 is provided to move the wafer chuck 5 in the normal-line direction of the wafer reference surface 3. Here, the wafer chuck 5 is adapted to adsorb the wafer 10 which will later be subjected to an exposure treatment. The main surface (to be later subjected to an exposure treatment) of the wafer 10 adsorbed by the wafer chuck 5, is caused to face towards the mask stage 2 and is kept parallel to the wafer reference surface 3.

A wafer-side laser displacement sensor 6 is attached on the wafer stage 1. When a reflective surface for reflecting a laser beam is disposed in front of the wafer-side laser displacement sensor 6 in parallel to the mask reference surface 4, the wafer-side laser displacement sensor 6 can operate to measure a distance between itself and the reflective surface. The measurement error of the laser displacement sensor 6 is 1 μm or less.

A mask chuck 7 is attached on the mask stage 2 for adsorbing and fixing the mask 11 (which is provided for use in an X-ray exposure treatment). A facing surface of the mask 11 adsorbed by the mask chuck 7 is caused to face towards the wafer stage 1, while being parallel to the mask reference surface 4.

A mask-side laser displacement sensor 8 is attached on the mask stage 2. When a reflective surface for reflecting a laser beam is disposed in front of the mask-side laser displacement sensor 8 in parallel to the wafer reference surface 3, the mask-side laser displacement sensor 8 can operate to measure a distance between itself and the reflective surface. The measurement error of the laser displacement sensor 8 is 1 μm or less.

An eddy current sensor 20 is attached on the wafer stage 1 by an actuator 21. A target 25 for use with the eddy current sensor 20 is attached on the mask stage 2 by an actuator 26. The eddy current sensor 20 has a sensor reference surface 22 in parallel with the wafer reference surface 3. The target 25 has a target reference surface 27 in parallel with the mask reference surface 4. When the target 25 is disposed in front of the eddy current sensor 20, the eddy current sensor 20 can operate to measure the distance between the sensor reference surface 22 and the target reference surface 27. The actuator 21 is adapted to adjust the height of the eddy current sensor 20 from the wafer reference surface 3, while the actuator 26 is adapted to adjust the height of the target 25 suspended from the mask reference surface 4.

Here, as the eddy current sensor 20, EX-500 series sensors manufactured by Keyence Corp. can be used. The resolution capability of the EX-500 series sensors is 0.3 μm to 3.0 μm. Further, the target 25 may be formed by a metal plate having a thickness of 0.5 mm or more.

A moving mechanism 15 is adapted to move the wafer 1 in a two-dimensional plane which is parallel to the wafer reference surface 3. Another moving mechanism 31 is adapted to move the mask stage 2 in a direction perpendicular to the mask reference surface 2. The laser displacement sensors 6, and 8, the eddy current sensor 20, the actuators 21, and 26, and the moving mechanisms 15, 16, and 31 are all controlled by a controller 40.

An X-ray light source 45 is provided to emit X-rays 46. Such an X-ray light source 45 is a synchrotron, so that the X-rays 46 are synchrotron radiation light (SR light). Here, the X-rays 46 are emitted to pass through the mask 11 so as to irradiate the exposure surface (which will later be subjected to an exposure treatment) of the wafer 10.

Figure 2:
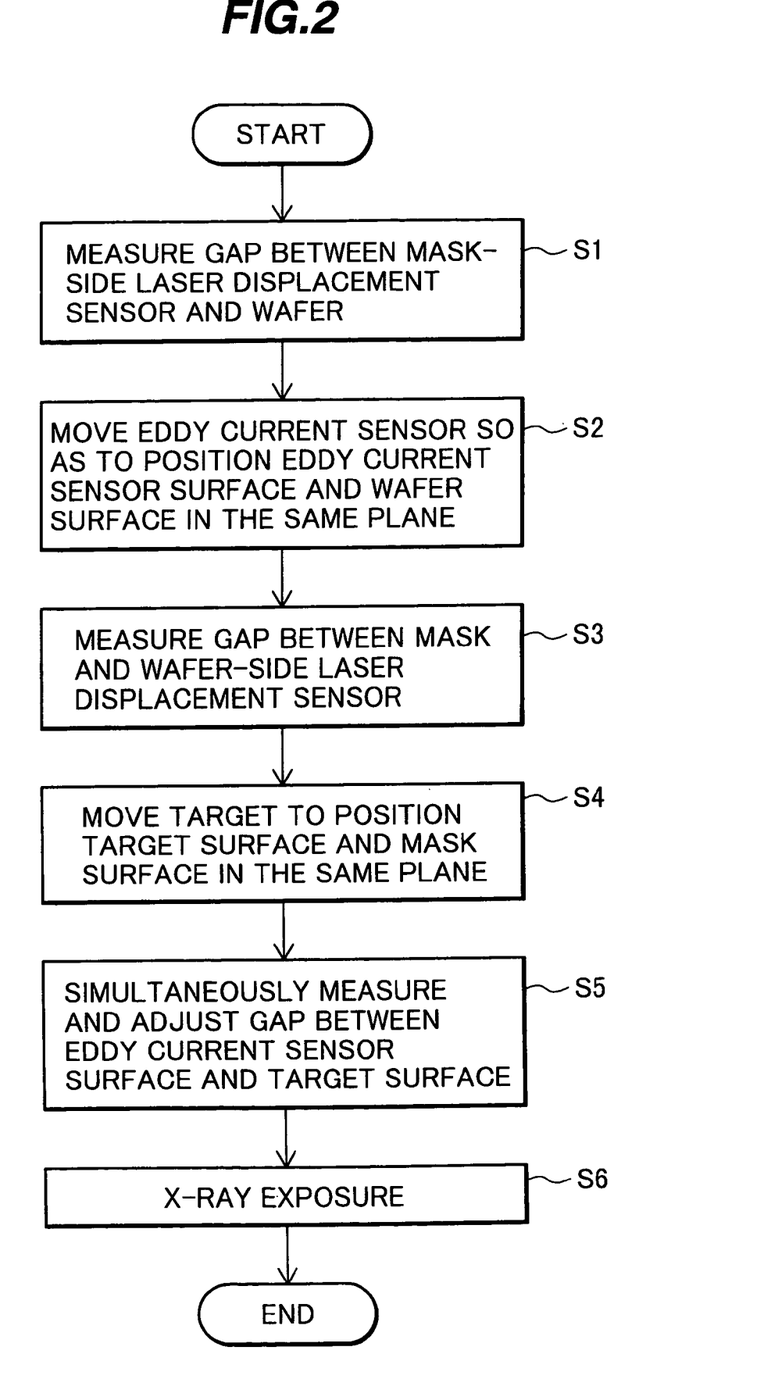
FIG. 2 is a flow chart showing a gap adjustment method according to a first embodiment of the present invention.

Next, FIG. 2 (which is a flow chart) will be used to explain a method for carrying out an X-ray exposure treatment. As shown in the flow chart, at step S1, the wafer stage 1 is moved so that a predetermined area of the main surface of the wafer 10 is positioned in front of the mask-side laser displacement sensor 8. Then, the mask-side laser displacement sensor 8 is operated to measure the distance between the mask-side laser displacement sensor 8 and the main surface of the wafer 10.

Then, the step goes to step S2 at which the wafer stage 1 is moved so that the eddy current sensor 20 is positioned in front of the mask-side laser displacement sensor 8, thereby measuring the distance between the mask-side laser displacement sensor 8 and the sensor reference surface 22 of the eddy current sensor 20. This measurement result is compared with the measurement result obtained at the above step S1, so as to adjust the height of the eddy current sensor 20 from the wafer reference surface 3, in such a manner that the sensor reference surface 22 and the main surface of the wafer 10 will be positioned in exactly the same plane. In fact, such an adjustment may be carried out by driving the actuator 21.

Subsequently, the step goes to step S3 at which the wafer stage 1 is moved so that a predetermined area of the surface of the mask 11 is positioned in front of the wafer-side laser displacement sensor 6. Then, the distance between the wafer-side laser displacement sensor 6 and the facing surface of the mask 11 is measured.

Afterwards, the step goes to step S4 at which the wafer stage 1 is moved so that the target 25 is positioned in front of the wafer-side laser displacement sensor 6, thereby measuring the distance between the wafer-side laser displacement sensor 6 and the target reference surface 27 of the target 25. This measurement result is compared with the measurement result obtained at the above step S3, so as to adjust the height of the target 25 from the wafer reference surface 3, in such a manner that the target reference surface 27 and the facing surface of the mask 11 will be positioned in exactly the same plane. In fact, such an adjustment may be carried out by driving the actuator 26.

Then, the step goes to step S5 at which the wafer stage 1 is moved so that the target 25 is positioned in front of the eddy current sensor 20, thereby using the eddy current sensor 20 to measure the distance between the sensor reference surface 22 and the target reference surface 27.

Afterwards, the mask stage 2 is moved in a direction perpendicular to the mask reference surface 4, so that the above distance can become close to a desired value. Here, the distance between the sensor reference surface 22 and the target reference surface 27 is equal to the distance between the main surface of the wafer 10 and the facing surface of the mask 11 (i.e., the distance between the wafer and the mask, or may be sometimes called a wafer-mask distance). In this way, the distance between the wafer and the mask can be made closer to the desired value.

Once the distance between the wafer and mask is in an allowable range, the step goes to step S6 so as to perform an X-ray exposure treatment.

The above-described first embodiment shows that it is possible to adjust the distance between the main surface of the wafer 10 and the facing surface of the mask 11 with high precision, without having to use expensive electrostatic capacitance type sensors and an expensive high-resolution camera. Further, with the use of the eddy current sensor 20, it is possible to constantly monitor the wafer-mask distance. In this way, when the wafer-mask distance deviates from a desired value, such a distance can be quickly returned to its original correct value.

Moreover, the laser displacement sensors and the eddy current sensor used in the first embodiment are all lightweight and compact. Therefore, even if the space surrounding the stages is not quite large enough, it is still possible to easily position these sensors without any difficulty. As a result, the total mechanical load on the stages can also be reduced.

Next, a modified embodiment will be described in relation to the above described first embodiment. In the first embodiment, at step S2 shown in FIG. 2, the height of the sensor reference surface 22 was made coincident with the height of the main surface of the wafer 10, while at step S4 the height of the target reference surface 27 was made coincident with the height of the facing surface of the mask 11. In the modified embodiment, at a step corresponding to step S2 of the first embodiment, the controller operates to store a difference between the height of the sensor reference surface 22 and the height of the main surface of the wafer 10. Further, at a step corresponding to step S4 of the first embodiment, the controller operates to store a difference between the height of the target reference surface 27 and the height of the main surface of the wafer 10. Thus, it is not necessary to adjust the height of the eddy current censor 20 and the height of the target 25.

At a step corresponding to step S5 of the first embodiment, a distance between the sensor reference surface 22 and the target reference surface 27 is measured. Thus, it is possible to calculate the actual wafer-mask distance, in accordance with a measured value of this distance between the sensor reference surface 22 and the target reference surface 27, a difference between the height of the sensor reference surface 22 and the height of the main surface of the wafer 10, as well as a difference between the height of the target reference surface 27 and the facing surface of the mask 11. In this modified embodiment, it is not necessary to use the actuators 21 and 26 shown in FIG. 1.

Figure 3:
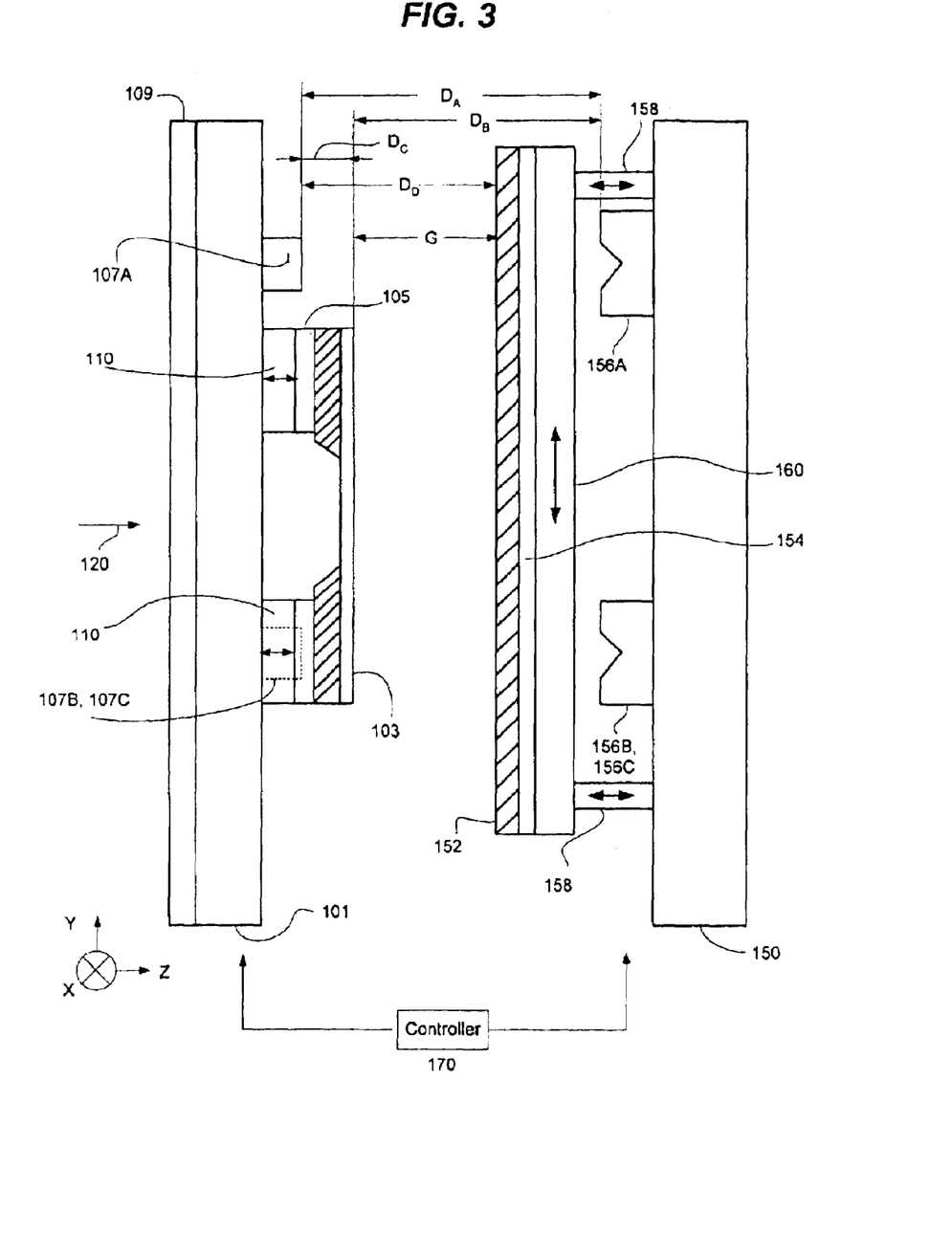
FIG. 3 is a schematic view showing a mask section and a wafer section of an X-ray exposure apparatus formed according to a second embodiment of the present invention.

FIG. 3 is a schematic view showing a distance adjustment apparatus formed according to a second embodiment of the present invention. As shown in the drawing, a mask stage 101 and a wafer stage 150 are arranged to be substantially parallel with each other, in a manner such that the mask holding surface and the wafer holding surface are in mutually facing positions. Further, an XYZ coordinate system is introduced in a manner such that its Z-axis is arranged in a direction perpendicular to the mutually facing surfaces of the mask stage 101 and the wafer stage 150.

Figure 4:
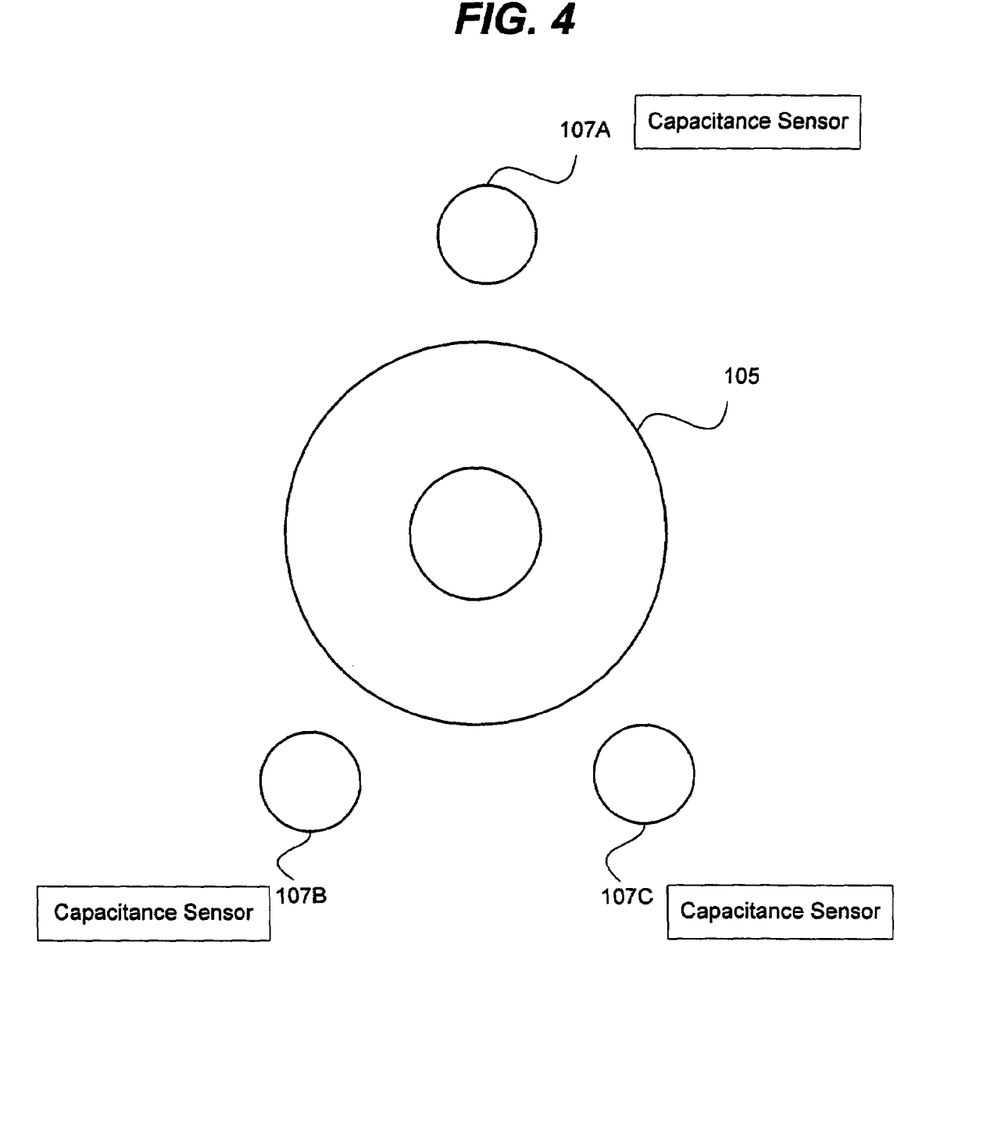
FIG. 4 is a front view showing a mask chuck and several electrostatic capacitance type sensors, which are all attached on the mask stage of the X-ray exposure apparatus formed according to the second embodiment of the present invention.

On the facing surface of the mask stage 101 there is provided a mask chuck 105 by a leveling mechanism 110. A mask 103 having a predetermined mask pattern is vacuum adsorbed on the mask chuck 105. The leveling mechanism 110 is adapted to adjust the height in the Z-axis direction, which height extends from the facing surface of the mask stage 101 to the mask 103 (i.e. the height in a direction perpendicular to the surface on which the mask pattern has been formed). Further, a plurality of electrostatic capacitance type sensors 107A to 107C are provided on the facing surface of the mask stage 101. These electrostatic capacitance type sensors 107A to 107C, as shown in FIG. 4, are disposed in three positions corresponding to three corners of an imaginary equilateral triangle having a common center with the mask chuck 105. Each of the electrostatic capacitance type sensors 107A to 107C is adapted to measure the distance from the corresponding electrostatic capacitance type sensor to an electrically conductive surface parallel to the X-Y plane. By actuating a two-axis moving mechanism 109, the mask stage 101 can move in two axes parallel to the facing surface of the mask stage 101, i.e., in the X direction as well as in the Y direction.

On the other hand, another two-dimensional moving mechanism 160 is installed on the facing surface of the wafer stage 150 by a leveling mechanism 158. A wafer chuck 154 is attached to the two-dimensional moving mechanism 160. The wafer chuck 154 is provided to vacuum adsorb the wafer 152. With the wafer 152 being vacuum adsorbed by the wafer chuck 154, the exposure surface of the wafer 152 will become parallel with the X-Y plane, so as to face the mask 103.

The leveling mechanism 158 is adapted to adjust the height from the facing surface of the wafer stage 150 to the wafer 152. The two-axis moving mechanism 160 is adapted to move the wafer 152 in two axes parallel to the exposure surface of the wafer, i.e. in the X direction as well as in the Y direction. Further, laser displacement sensors 156A to 156C are provided on the facing surface of the wafer stage 150. These laser displacement sensors 156A to 156C are disposed in positions corresponding to the electrostatic capacitance type sensors 107A to 107C. Each of the laser displacement sensors 156A to 156C is adapted to measure a distance from the corresponding laser displacement sensor to a plane parallel to the X-Y plane, i.e. the distance in the Z direction.

The leveling mechanisms 110 and 158, the two-axis moving mechanisms 109 and 160, the electrostatic capacitance type sensors 107A to 107C, and the laser displacement sensors 156A to 156C are all controlled by a controller 170. X-rays 120 are for example synchrotron radiation light which irradiates the mask 103 on the mask stage 101, thereby transferring a pattern formed on the mask 103 to the exposure surface of the wafer 152.

Next, a detailed description will be given to explain a method for adjusting a gap between the mask 103 and the wafer 152 in the X-ray exposure apparatus shown in FIG. 3.

Here, it is supposed that the calibration of the three laser displacement sensors 156A to 156C, as well as the calibration of the three electrostatic capacitance type sensors 107A to 107C have all been finished. Namely, when the distance from the facing surface of the wafer stage 150 to a plane positioned at a certain height from the facing surface has been measured, the measured values produced by the laser displacement sensors 156A to 156C should all be coincident with one another. Further, when the distance from the facing surface of the mask stage 101 to a plane positioned at a certain height from the facing surface has been measured, the measured values produced by the electrostatic capacitance type sensors 107A to 107C should all be coincident with one another.

The mask 103 is fixed on the mask chuck 105, while the wafer 152 is fixed on the wafer chuck 154. At three positions not arranged along a straight line on the exposure surface of the wafer 152, the distance is between the exposure surface and the three electrostatic capacitance type sensors 107A to 107C is measured. Then, the leveling mechanism 158 is driven so as to make all the measured results equal to one another. Further, at three positions not arranged along a straight line on the surface of the mask 103, any one of the laser displacement sensors 156A to 156C is used to measure the distance between the corresponding laser displacement sensor and the mask surface. Then, the leveling mechanism 110 is driven so as to make all three measured results equal to one another. Subsequently, the two-axis moving mechanism 109 is operated in a manner such that the measurement points on the surface of the mask 103 can be located in front of the laser displacement sensors, thereby measuring the distances between the laser displacement sensors and the measurement points. In this way, a plane on which the mask pattern of the mask 103 has been formed can be made parallel to the exposure surface of the wafer 152. Moreover, since there are provided three electrostatic capacitance type sensors 107A to 107C and three laser displacement sensors 156A to 156C, when the leveling step is being carried out, it is possible to reduce the distances moved by both the mask 103 and the wafer 152 in both the X direction and the Y direction.

During the leveling step, a distance $D_B$ between the laser displacement sensor 156A and the surface of the mask 103, i.e., extending in the Z-axis direction, is measured.

Afterwards, the two-axis moving mechanism 109 is operated to have the electrostatic capacitance type sensor 107A located in front of the laser displacement sensor 156A. Then, the laser displacement sensor 156A is used to measure a distance $D_A$ extending from the laser displacement sensor 156A to the electrostatic capacitance type sensor 107A. However, since the distance $D_A$ does not change even if the mask 103 and the wafer 152 are replaced by new ones, it is not necessary to perform measurement every time the mask 103 and the wafer 152 are replaced. The difference between the distance $D_A$ and the distance $D_B$ corresponds to a distance $D_C$ between the surface of the electrostatic capacitance type sensor 107A and the mask 103.

Then, the electrostatic capacitance type sensor 107A is used to measure a distance $D_D$ between the surface of the electrostatic capacitance type sensor 107A and the exposure surface of the wafer 152, i.e., extending in the Z-axis direction. A gap G between the surface of the mask 103 and the exposure surface of the wafer 152 can be calculated in accordance with the following equation:

$$G = D_D - D_C = D_D - (D_A - D_B)$$

Here, the difference between the desired value and the gap G obtained according to the above equation may be calculated. By driving the leveling mechanism 158, the wafer 152 can be moved only by a distance corresponding to the difference. In the above step, the distance between the mask 103 and the wafer 152 can be adjusted to make the distance value close to the desired value.

Preferably, it is desired that the gap G does not change even if the two-axis moving mechanism 160 is operated. However, in fact, the distance G will still change a little within the allowable precision range of the two-axis moving mechanism 160. On the other hand, even if the two-axis moving mechanism 160 is actuated, the distance $D_A$ and the distance $D_B$ will not change. For this reason, after the two-axis moving mechanism 160 has been actuated and an exposure area of the exposure surface of the wafer 152 has been moved, it is possible to detect a change of the gap G and to compensate for a deviation of the gap G by re-measuring only the distance $D_D$.

With the use of the above X-ray exposure apparatus formed according to the second embodiment of the present invention, it is possible to correctly measure the distance between the mask and the wafer without having to use a high-resolution camera. Further, since it is not necessary to employ an expensive and large high-resolution camera, it is possible to manufacture an improved exposure apparatus which is compact and low-cost.

The measurement error of each laser displacement sensor is about ±0.1 μm, while the measurement error of each electrostatic capacitance type sensor is ±50 nm. Accordingly, each of the distances $D_A$ and $D_B$ will contain at most an error of ±0.1 μm, while the distance $D_D$ will contain at most an error of ±0.01 μm. In this way, it is possible to obtain the gap G with a precision of about ±0.2 μm.

Although it has been described in the above second embodiment that there are provided three electrostatic capacitance type sensors 107A to 107C and three laser displacement sensors 156A to 156C, it is possible to provide only one electrostatic capacitance type sensor and only one laser displacement sensor. By operating the two-axis moving mechanism 160, it is possible to measure the distances between the electrostatic capacitance type sensors and the wafer 152 at three positions on the exposure surface of the wafer 152. Similarly, by operating the two-axis moving mechanism 109, it is possible to measure the distances between the laser displacement sensors and the mask 103 at three positions on the surface of the mask 103.

Moreover, although it has been described in the above second embodiment that the laser displacement sensors are disposed on the wafer stage 150 and the electrostatic capacitance type sensors are disposed on the mask stage 101, it is also possible to dispose other types of distance sensors. For example, if an electrically conductive film is formed on an area (not containing the mask pattern) on the surface of the mask 103, it is possible that electrostatic capacitance type sensors can be used to replace the laser displacement sensors. Since the electrostatic capacitance type sensors have a lower price, a higher precision, and a smaller size than the laser displacement sensors, it is possible to manufacture an exposure apparatus which is compact and which can be produced at low cost.

In the second embodiment, the mask chuck 105 is mounted on the mask stage 101 via the leveling mechanism 110. However, the mask chuck 105 may be fixed to the mask stage 101 without the leveling mechanism 110. In such case, the mask stage itself is moved in the Z-axis direction by another leveling mechanism. When the mask chuck 105 is fixed to the mask stage 101, the distance Dc does not change as long as the mask 103 is not changed.

Figure 5:
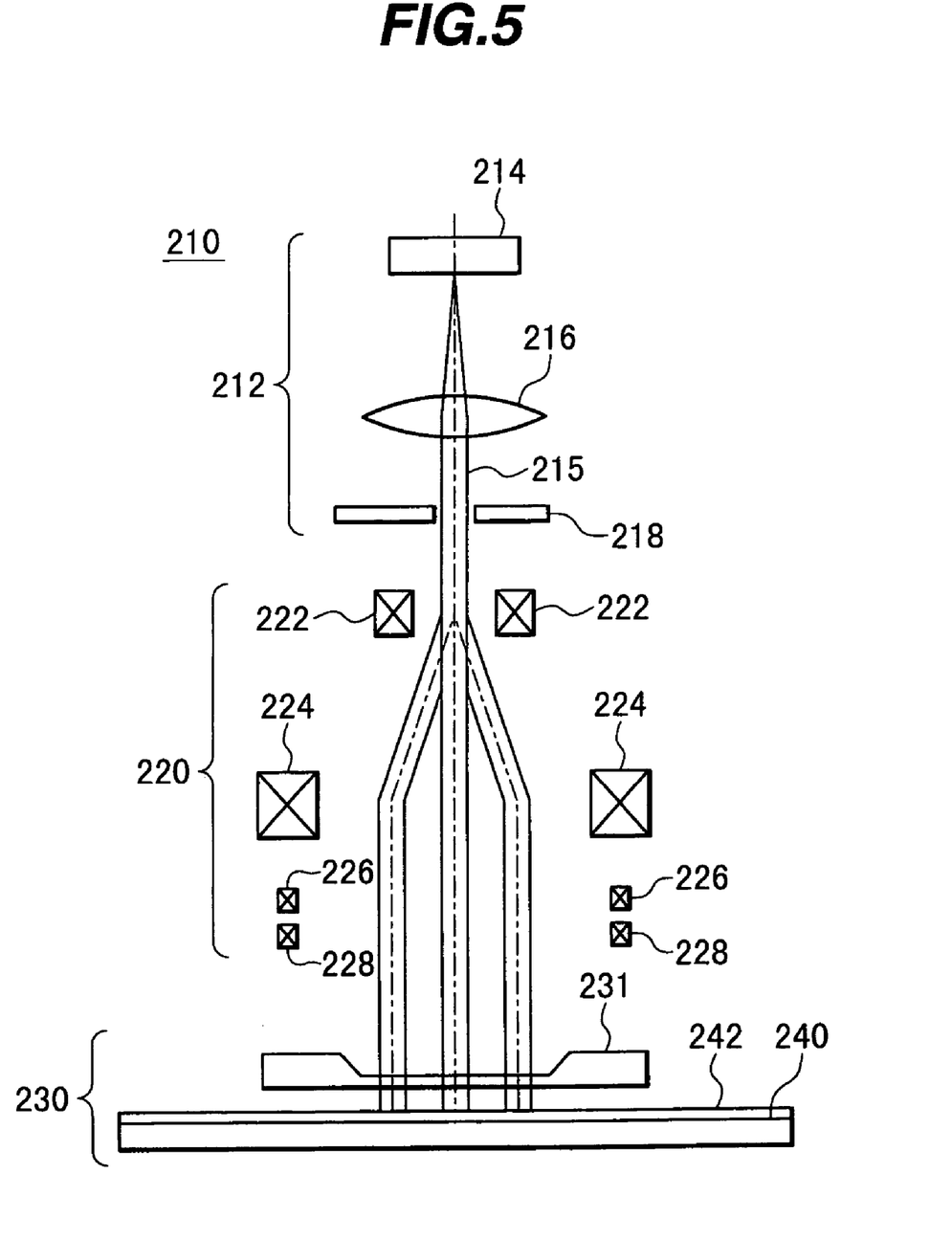
FIG. 5 is an explanatory view schematically showing an electron beam proximity exposure equipment using a gap adjustment apparatus formed according to a third embodiment of the present invention.

FIG. 5 is an explanatory view showing an electron beam approaching exposure equipment 210 involving the use of a gap adjustment apparatus formed according to the third embodiment of the present invention.

As shown in the drawing, the electron beam approaching exposure equipment 210 comprises an electron gun 212, a beam scanning section 220 and a gap adjustment apparatus 230. The electron gun 212 includes an electron beam source 214, an electrostatic lens 216 and an aperture 218. The electron beam source 214 is adapted to emit an electron beam. In fact, the electrostatic lens 216 is provided to convert the electron beam emitted from the electron beam source 214 into a collimated beam 215. The collimated beam 215 is then shaped by the aperture 218 and allowed to enter the beam scanning section 220.

The beam scanning section 220 comprises main deflectors 222 and 224 as well as auxiliary deflectors 226 and 228. In this way, the beam scanning section 220 can perform a desired beam scanning.

The gap adjustment apparatus 230 is so formed that it can keep a mask 231 in a position through which the scanning electron beam is passing. A wafer 240 is arranged to face the mask 231, with a small gap (a proximity gap) formed therebetween. A resist film 242 to be exposed by the electron beam is formed on the wafer 240's one surface facing the mask 231. In this manner, the electron beam passing through the mask 231 may be incident on the resist film 242, thereby enabling the pattern of the mask 231 to be transferred to the resist film 242.

Figure 6A:
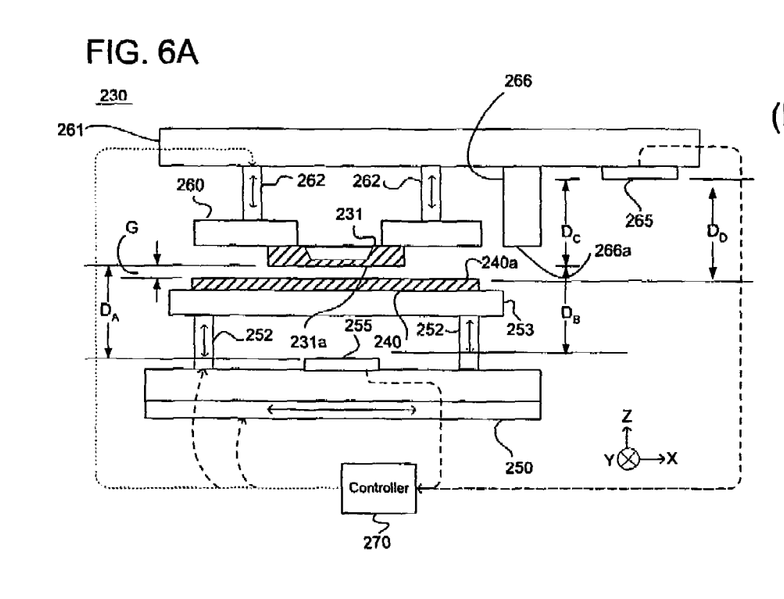
FIG. 6A is an explanatory view schematically showing the gap adjustment apparatus formed according to the third embodiment of the present invention.

FIG. 6A is another explanatory view showing in more detail the gap adjustment apparatus 230 formed according to the present embodiment of the present invention. As shown in the drawing, a wafer stage 251 is held by an XY driving mechanism 250, in a manner such that the wafer stage is movable in a two-dimensional plane which is parallel to the XY plane. A wafer chuck 253 is attached to the wafer stage 251 through three Z-direction driving mechanisms 252. In fact, the three Z-direction driving mechanisms 252 are provided to move the wafer chuck 253 in the Z-direction perpendicular to the XY-plane. In particular, the three Z-direction driving mechanisms 252 are so formed that their driving amounts can be different from one another. As a result, an inclining angle of the wafer chuck 253 with respect to the XY-plane may be properly adjusted. In use, the wafer chuck 253 can hold a wafer 240 by means of an electrostatic chuck mechanism. Actually, the XY driving mechanism 250 and the Z-direction driving mechanism 252 are provided to operate in accordance with an instruction issued by a controller 270.

A mask chuck 260 is provided to hold the mask 231 by means of an electrostatic mechanism. The mask 231 held by the mask chuck 260 is arranged to face the wafer 240 held by the wafer chuck 253, in a manner such that an extremely small gap is formed between the wafer 240 and the mask 231. Here, two mutually facing surfaces of the wafer 240 and the mask 231 are referred to as a measurement surface 240a and a measurement surface 231a. Specifically, at least one portion of each of the measurement surfaces 231a and 240a is formed by an electrically conductive material, with each electrically conductive portion connected to an earth potential. For example, the measurement surface 240a of the wafer 240 is made of silicon. Silicon can be regarded as an electrically conductive material. Further, a resist film to be subjected to the electron beam exposure is formed on the measurement surface 240a of the wafer 240.

The mask chuck 260 is connected to a mask stage 261 by means of three Z-direction driving mechanisms 262 which are adapted to move the mask chuck 260 in the Z-direction. In particular, the three Z-direction driving mechanisms 262 are so formed that their driving amounts are different from one another. As a result, an inclining angle of the mask chuck 260 with respect to the XY-plane can be properly adjusted. Actually, these Z-direction driving mechanisms 262 will operate in accordance with an instruction issued by a controller 270.

An electrostatic capacity type displacement gauge (electrostatic capacitance type sensor) 255 for use with the mask 231 is attached on the wafer stage 251. Here, the electrostatic capacity type displacement gauge 255 is arranged to face the mask 231. On the other hand, another electrostatic capacity type displacement gauge 265 for use with the wafer as well as a target 266 is attached on the mask stage 261. Specifically, the target 266 has a target measurement surface 266a facing in the same direction as the measurement surface 231a of the mask 231. Further, the target measurement surface 266a is formed by an electrically conductive material and connected to an earth potential. A Z-direction distance $D_C$ between the electrostatic capacity type displacement gauge 265 and the target measurement surface 266a is measured correctly in advance with the use of a laser displacement gauge. In particular, the target 266 is fixed relatively with respect to the electrostatic capacity type displacement gauge 265. As a result, the distance $D_C$ is not variable once the setting of the apparatus is completed.

Figure 6B:
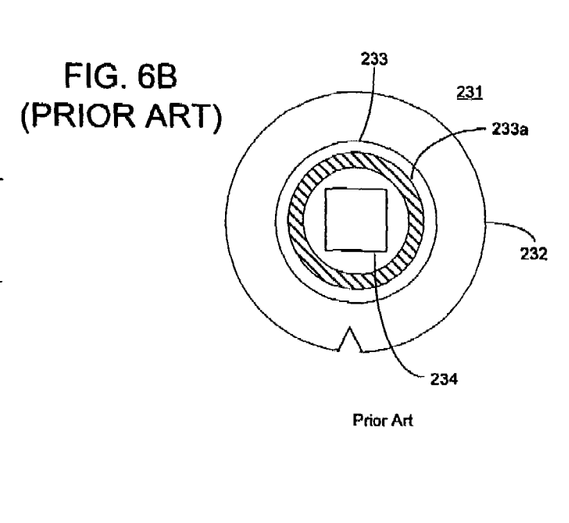
FIG. 6B is a front view of a mask.

FIG. 6B is a front view of the mask 231 of NIST format. As shown in the drawing, the mask 231 includes an annular frame 232 formed by aluminum and a support plate 233 formed by silicon. A square membrane 234 having a pattern to be transferred is held on the central portion of the support plate 233. In fact, the surface of the support plate 233 serves to define the measurement surface 231a of the mask 231. Here, each of the four edges of the square membrane 234 has a length of 40 to 50 mm, while the support plate 233 has a diameter of 125 mm. Specifically, with regard to the support plate 233, an annular area 233a having a width of about 10 mm surrounding the membrane 234 is an area which is so formed that its displacement amount can be detected by means of the electrostatic capacity type displacement gauge.

In this way, by driving the XY driving mechanism 250 and by disposing the electrostatic capacity type displacement gauge 255 on the front of any portion of the annular area 233a, it is possible to measure a displacement amount of the mask 231 at the time when the reference surface of the electrostatic capacity type displacement gauge 255 is used as an original point of the displacement amount. Here, a distance between the electrostatic capacity type displacement gauge 255 and its reference surface may be determined in advance. Therefore, the measuring of the displacement amount of the measurement surface 231 a is equivalent to the measuring of a distance $D_A$ between the electrostatic capacity type displacement gauge 255 and the measurement surface 231a. In the present specification, a process using an electrostatic capacity type displacement gauge to measure a displacement amount extending from the reference surface to a measurement surface is referred to as "measuring a distance extending from the electrostatic capacity type displacement gauge to the measurement surface".

Here, by driving the XY driving mechanism 250 and by disposing the electrostatic capacity type displacement gauge 255 on the front surface of the target 266, it is possible to measure a distance $D_B$ between the electrostatic capacity type displacement gauge 255 and the target measurement surface 266a. In this way, by driving the XY driving mechanism 250 and by disposing the wafer chuck 253 in a manner such that the electrostatic capacity type displacement gauge 265 may be positioned on the front surface of the wafer 240, it is possible to measure a distance $D_D$ between the electrostatic capacity type displacement gauge 265 and the measurement surface 240a of the wafer 240. The measurement results of the electrostatic capacity type displacement gauges 255 and 265 are fed into the controller 270.

In general, a measurable distance of the electrostatic capacity type displacement gauge is about 0.5 mm or more. Further, with regard to the mask 231, when an area 233a serving as the target of the electrostatic capacity displacement gauge 255 has a width of about 10 mm, a measurable distance of the electrostatic capacity type displacement gauge 255 is for example about 1.5 mm or less. For this reason, as an example, the distance $D_A$ and the distance $D_D$ are set to be about 1 mm, while the distance $D_B$ is set to be about 1.3 mm.

Next, description will be given to explain a method for adjusting a gap between the mask 231 and the wafer 240, using a gap adjustment apparatus shown in 6A.

At first, distances are measured which are extending between the electrostatic capacity type displacement gauge 255 and at least three points on the measurement surface 231a of the mask 231. Then, in accordance with the measurement results, the Z-direction driving mechanism 262 is operated in a manner such that the measurement surface 231 a of the mask 231 becomes parallel with the XY plane. In this way, after the measurement surface 231 a has been made parallel with the XY plane, the distance $D_A$ is thus measured. Further, the distance $D_B$ is also measured.

Subsequently, distances are measured which are extending between the electrostatic capacity type displacement gauge 265 and at least three points on the measurement surface 240a of the wafer 240. Then, in accordance with the measurement results, the Z-direction driving mechanism 252 is operated in a manner such that the measurement surface 240a of the wafer 240 becomes parallel to the XY plane. In this way, after the measurement surface 240a has been made parallel with the XY plane, the distance $D_D$ can thus be measured.

A gap between the mask 231 and the wafer 240 may be represented by the following equation.

$$G = D_A + D_D - (D_B + D_C) \qquad (1)$$

At this time, the Z-direction driving mechanism 252 or the Z-direction driving mechanism 262 is operated in a manner such that the gap G will arrive at a desired value. Therefore, it is possible to measure the gap G.

Preferably, the distance $D_B$ is measured only once and there is no variation thereafter. For this reason, it is not necessary to again perform the measurement when the mask 231 and the wafer 240 are changed. However, since the distance $D_B$ will change with the passing of time, it is preferred to periodically measure the distance $D_B$ and renew it into a new value.

In the above embodiment, only the electrostatic capacity type displacement gauges are used as the displacement gauges. Since each electrostatic capacity type displacement gauge does not generate a magnetic field during a period when distance measurement is not being performed, it does not produce any influence in the proceeding direction of the electron beam. Further, since the electrostatic capacity type displacement gauge is simpler in its structure than a laser displacement gauge and does not contain a print board which is often responsible for degassing, the gap adjustment apparatus of the present embodiment is suitable for use in a vacuum atmosphere, such as in an electron beam approaching exposure apparatus. Moreover, since the gap adjustment apparatus of the present embodiment is not required to incorporate high price and high resolution camera, it is allowed to manufacture the entire apparatus at a reduced cost.

Here, taking into account the characteristics of the electrostatic capacity type displacement gauge, a distance $D_D$ between the electrostatic capacity type displacement gauge 265 and the wafer 240 is preferred to be set at about 1 mm. For the same reason, a distance $D_A$ between the electrostatic capacity type displacement gauge 255 and the mask 231 is also preferred to be set at about 1 mm. A gap G between the wafer 240 and the mask 231 is usually set at about 50 μm. For this reason, a distance $D_B+D_C$ between the two electrostatic capacity type displacement gauges 255 and 265 will become about 2 mm, and will extend beyond the distance measurable range of the electrostatic capacity type displacement gauges. As a result, it is impossible to directly measure the right side $D_B+D_C$ of equation (1). Even if the data indicating the distance $D_B+D_C$ was obtained, the data would include a large measurement error because the area of the front surface of the electrostatic capacity type displacement gauge is not large enough to be used as an object to be measured by the electrostatic capacity type displacement gauge.

In the case of the above embodiment, by disposing the target measurement surface 266a of the target 266 within the distance measurable range of the electrostatic capacity type displacement gauge 255, it is possible to measure a distance $D_B+D_C$ between the two electrostatic capacity type displacement gauges 255 and 265.

Further, although it has been described in the above embodiment that the electrostatic capacity type displacement gauges are used as displacement gauges, it is also possible to use optical fiber type displacement gauges. An optical fiber type displacement gauge is formed in a manner such that a light is emitted from end face of optical fiber and such a light is incident on an object whose distance is to be measured. Then, the light is reflected from the object and the reflected light is received, thereby allowing the desired distance measurement in accordance with an amount of the received light. In the case where an optical fiber type displacement gauge is utilized, it is not absolutely necessary to dispose the target 266.

Thus, in the case where the target 266 is not disposed, it is also possible to directly measure the distance $D_B+D_C$ between the two displacement gauges 255 and 265 shown in FIG. 6A. If the directly measured distance between the two displacement gauges 255 and 265 is defined as $D_E$, a gap G can be represented in the following equation.

$$G = D_A + D_D - D_E \quad (2)$$

Although the present invention has been described in accordance with the above embodiments, this invention should not be limited to those specific embodiments. An ordinary person skilled in the art can easily perform any modification, improvement and combination based on the above embodiments.

What is claimed is:

1. A gap adjustment method comprising the steps of:
holding a first object having a first measurement surface and a second object having a second measurement surface, wherein the second measurement surface faces the first measurement surface;
using a first displacement gauge facing the first measurement surface to measure a distance $D_D$ extending from the first displacement gauge to the first measurement surface;
using a second displacement gauge facing the second measurement surface to measure a distance $D_A$ extending from the second displacement gauge to the second measurement surface;
using a distance $D_E$ extending from the first displacement gauge to the second displacement gauge, the distance $D_D$ and the distance $D_A$ to calculate $D_A+D_D-D_E$ and obtain a gap between the first measurement surface and the second measurement surface,
wherein the first and second displacement gauges are optical fiber displacement gauges.

2. A gap adjustment method comprising the steps of:
holding a first object having a first measurement surface and a second object having a second measurement surface, in a manner such that the second measurement surface is caused to face the first measurement surface;
using a first displacement gauge facing the first measurement surface, to measure a distance $D_D$ extending from the first displacement gauge to the first measurement surface;
using a second displacement gauge facing the second measurement surface, to measure a distance $D_A$ extending from the second displacement gauge to the second measurement surface;
obtaining an information specifying a gap between the first measurement surface and the second measurement surface, in accordance with a distance $D_E$ extending from the first displacement gauge to the second displacement gauge, as well as the distance $D_D$ and $D_A$;
using the information specifying the gap between the first measurement surface and the second measurement surface to move at least one of the first object and the second object to change the gap between the first measurement surface and the second measurement surface, wherein the distance $D_E$ does not change.

3. The gap adjustment method according to claim 2, wherein during the step of obtaining the information specifying the gap between the first measurement surface and the second measurement surface, the gap between the first measurement and second measurements surfaces is obtained by calculating $D_A+D_D-D_E$.

* * * * *